(12) United States Patent
Yoo et al.

(10) Patent No.: US 10,096,661 B2
(45) Date of Patent: Oct. 9, 2018

(54) DISPLAY DEVICE

(71) Applicant: SAMSUNG DISPLAY CO., LTD., Yongin-si, Gyeonggi-do (KR)

(72) Inventors: Byung Han Yoo, Seoul (KR); Young Chan Kim, Incheon (KR); Kyung Tea Park, Seoul (KR); Yong-Suk Yeo, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 184 days.

(21) Appl. No.: 15/219,681

(22) Filed: Jul. 26, 2016

(65) Prior Publication Data

US 2017/0133441 A1 May 11, 2017

(30) Foreign Application Priority Data

Nov. 11, 2015 (KR) ........................ 10-2015-0158259

(51) Int. Cl.
*H01L 51/52* (2006.01)
*H01L 27/32* (2006.01)

(52) U.S. Cl.
CPC ...... *H01L 27/3227* (2013.01); *H01L 51/5271* (2013.01); *H01L 27/3244* (2013.01)

(58) Field of Classification Search
CPC ............. H01L 27/3227; H01L 27/3244; H01L 51/5271; G06F 1/1605; G09G 2360/14–2360/148
See application file for complete search history.

(56) References Cited

U.S. PATENT DOCUMENTS

| | | | | |
|---|---|---|---|---|
| 2010/0007632 A1* | 1/2010 | Yamazaki | ............. | G06F 1/1616 345/175 |
| 2012/0092302 A1* | 4/2012 | Imai | ...................... | G06F 3/0412 345/175 |
| 2014/0213323 A1* | 7/2014 | Holenarsipur | ....... | H03K 17/955 455/566 |
| 2016/0161783 A1* | 6/2016 | Kim | .................... | G02F 1/13318 349/116 |
| 2017/0337413 A1* | 11/2017 | Bhat | .................... | G06K 9/0002 |

FOREIGN PATENT DOCUMENTS

| | | | |
|---|---|---|---|
| JP | 07-043699 A | | 2/1995 |
| JP | 2010019938 A | * | 1/2010 |
| KR | 10-0826187 B1 | | 4/2008 |
| KR | 10-1040653 B1 | | 6/2011 |
| KR | 10-2012-0081943 A | | 7/2012 |
| KR | 10-2014-0048110 A | | 4/2014 |

* cited by examiner

*Primary Examiner* — Mariceli Santiago
(74) *Attorney, Agent, or Firm* — Innovation Counsel LLP

(57) ABSTRACT

A display device includes: a display panel including a display area for displaying an image; a window provided on an upper portion of the display panel; a protection plate provided on a lower portion of the display panel; and a photosensor provided at least one of between the display panel and the window and between the display panel and the protection plate, wherein the photosensor includes a shutter for controlling light emitted by the display panel to transmit through the window or the protection plate, and a photodetector for receiving the light reflected after transmitting through the window or the protection plate.

23 Claims, 14 Drawing Sheets

DISPLAY DEVICE

CROSS-REFERENCE TO RELATED APPLICATION

This application claims priority to and the benefit of Korean Patent Application No. 10-2015-0158259 filed in the Korean Intellectual Property Office on Nov. 11, 2015, the disclosure of which is incorporated herein by reference in its entirety.

BACKGROUND (a) Technical Field

The present disclosure relates to a display device. More particularly, the present disclosure relates to a display device including a photosensor.

(b) Description of the Related Art

Sports and leisure cultures have been globally activated, so interests in physical exercises and health are continuously increasing. In particular, demands for devices and applications that can provide real-time monitoring of physical conditions such as a heart rate and a body temperature during a workout and notify bodily risks to prevent injuries and accidents are increasing.

An essential metric for measuring physical activities is a heart rate. To measure a heart rate, various devices that contact a body part is used. Typical forms of heart rate measurement devices include a chest band or a wristband.

For example, a heart rate is measured with a photosensor equipped with a photodiode. The photosensor receives light reflected by blood to measure an amount of blood. However, the photosensor requires a light source to irradiate light to blood, and the light source increases power consumption and the product cost.

The above information disclosed in this Background section is only for enhancement of understanding of the background of the present disclosure and therefore it may contain information that does not form a prior art that is already known to a person of ordinary skill in the art.

SUMMARY

The present disclosure has been made in an effort to provide a display device including a photosensor without an additional light source.

An exemplary embodiment provides a display device including: a display panel including a display area for displaying an image; a window provided on an upper portion of the display panel; a protection plate provided on a lower portion of the display panel; and a photosensor provided at least one of between the display panel and the window and between the display panel and the protection plate, wherein the photosensor includes a shutter for controlling light emitted by the display panel to transmit through the window or the protection plate, and a photodetector for receiving the light reflected after transmitting through the window or the protection plate.

The photosensor may be disposed on a position corresponding to the display area between the display panel and the protection plate.

The display panel may include an organic light emitting diode of a double-side emission type provided in the display area.

The organic light emitting diode may include: a first electrode connected to a thin film transistor provided on a substrate; an organic emission layer provided on the first electrode; and a second electrode provided on the organic emission layer, wherein the first and second electrodes are transparent electrodes.

The thin film transistor may include: a semiconductor layer provided on the substrate; a gate electrode provided on the semiconductor layer; and a source electrode and a drain electrode provided on the gate electrode and connected to the semiconductor layer.

The display panel may further include a peripheral area disposed on a periphery of the display area, and the photosensor may be disposed on a position corresponding to the peripheral area between the display panel and the protection plate.

The display panel may include a dummy pixel provided in the peripheral area.

The dummy pixel may be an organic light emitting diode of a bottom-emission type.

The organic light emitting diode may include: a first electrode connected to a thin film transistor provided on a substrate; an organic emission layer provided on the first electrode; and a second electrode provided on the organic emission layer, wherein the first electrode may be a transparent electrode, and the second electrode may be a reflecting electrode.

The display panel may further include a peripheral area disposed on a periphery of the display area, and the photosensor may be disposed on a position corresponding to the peripheral area between the display panel and the window.

The display panel may include a dummy pixel provided in the peripheral area.

The dummy pixel may be an organic light emitting diode of a top-emission type.

The organic light emitting diode may include: a first electrode connected to a thin film transistor provided on a substrate; an organic emission layer provided on the first electrode; and a second electrode provided on the organic emission layer, wherein the first electrode may be a reflecting electrode, and the second electrode may be a transparent electrode.

The photodetector may include at least one photodiode.

The protection plate may include a light transmitting window on a position corresponding to the photosensor.

The shutter may include first and second blocking plates that can be controlled to be opened and closed.

The first and second blocking plates may be bent.

The first and second blocking plates may be made of a conductive material.

The shutter may further include an induction electrode provided on at least one of an upper side and a lower side of the first and second blocking plates and generating an electric force.

A reflective layer may be provided on the first and second blocking plates.

The reflective layer may be made of a metal selected from silver (Ag), aluminum (Al), and chromium (Cr), or an alloy thereof.

A first end of the first and second blocking plates may be inclined at a predetermined angle, and a second end of the first and second blocking plates is made of a shape corresponding to the first end.

A first end of the first and second blocking plates may be provided to have a step shape, and a second end of the first and second blocking plates is made of a shape corresponding to the first end.

According to the display device, the photosensor may not use an additional light source but may use the light emitted

DETAILED DESCRIPTION OF THE EMBODIMENTS

Figure 1:
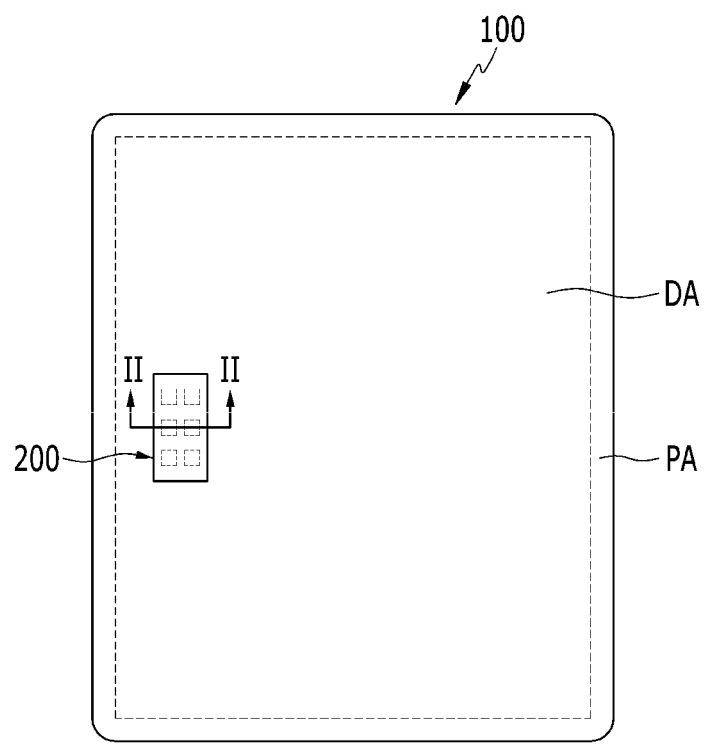
FIG. 1 shows a top plan view of a display device, according to an exemplary embodiment of the present disclosure.

In the following detailed description, only certain exemplary embodiments will be shown and described, simply by way of illustration. As those skilled in the art would realize, the described embodiments may be modified in various different ways, without departing from the spirit or scope of the present disclosure. The drawings and description are to be regarded as illustrative in nature and not restrictive. Like reference numerals designate like elements throughout the specification.

The size and thickness of each component illustrated in the drawings are arbitrarily illustrated in the drawings for better understanding and ease of description, but the present disclosure is not limited to the illustrations.

In the drawings, the thickness of layers, films, panels, regions, etc., may be exaggerated for clarity. The thickness of the layers, films, panels, regions, etc., may be enlarged in the drawings for better understanding and ease of description. It will be understood that when an element such as a layer, film, region, or substrate is referred to as being "on" another element, it can be directly on the other element or one or more intervening elements may also be present.

In addition, unless explicitly described to the contrary, the word "comprise" and variations such as "comprises" or "comprising" will be understood to imply an inclusion of stated elements but not an exclusion of any other elements. Throughout this specification, it is understood that the term on and similar terms are used generally and are not necessarily related to a gravitational reference.

A display device according to an exemplary embodiment will now be described with reference to FIG. 1 to FIG. 3.

Figure 2:
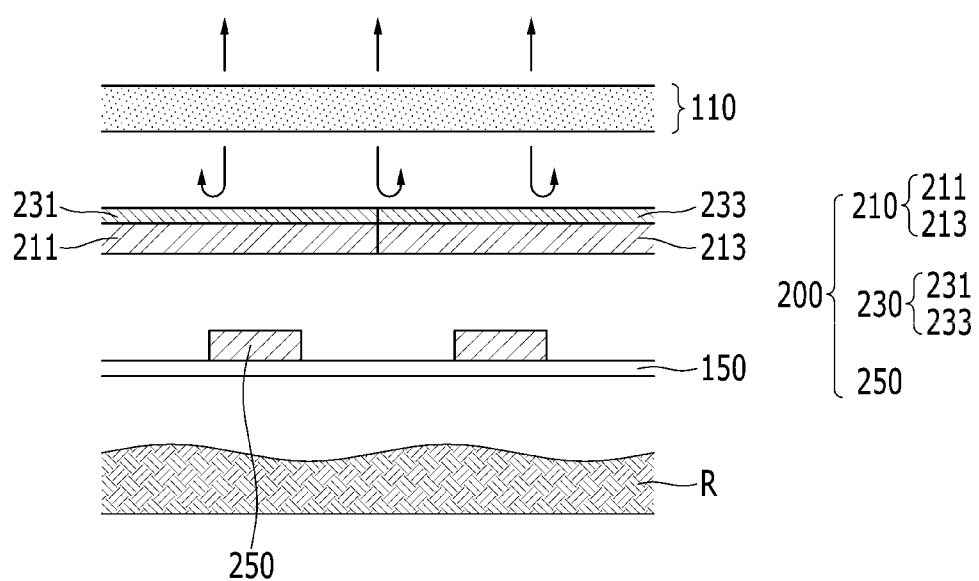
FIG. 2 shows a cross-sectional view of a display device with respect to a line II-II of FIG. 1.
Figure 3:
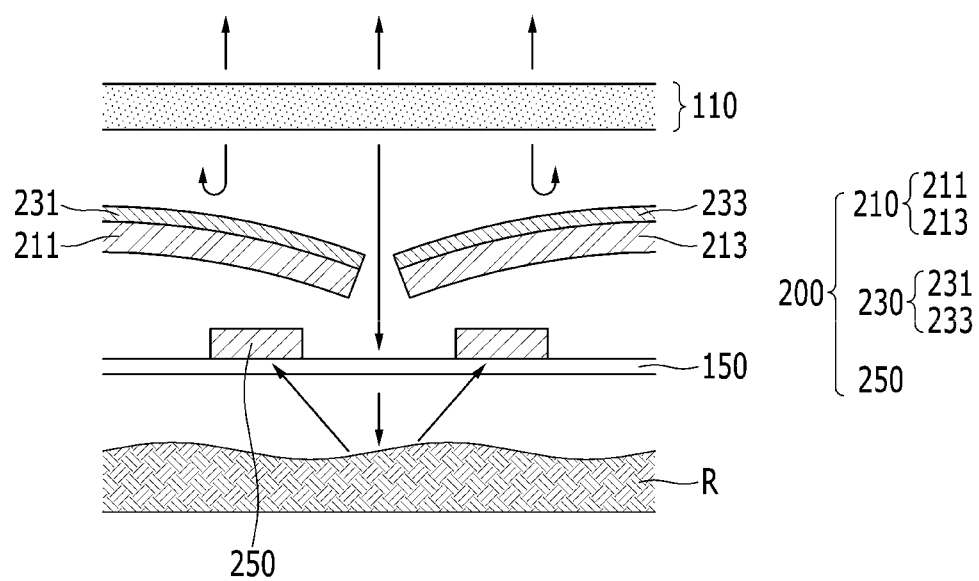
FIG. 3 shows a cross-sectional view showing that a shutter is opened.

FIG. 1 shows a top plan view of a display device, according to an exemplary embodiment of the present disclosure, FIG. 2 shows a cross-sectional view of a display device with respect to a line II-II of FIG. 1, and FIG. 3 shows a cross-sectional view showing that a shutter is opened.

Referring to FIG. 1 to FIG. 3, the display device 100 includes a display panel 110, a protection plate 150, and a photosensor 200. The photosensor 200 does not use an additional light source, but uses the light emitted by the display panel 110.

Referring to FIG. 1 and FIG. 2, the display panel 110 is divided into a display area (DA) and a peripheral area (PA). The display area (DA) emits light to display an image through a plurality of pixels. The peripheral area (PA) is provided on a periphery of the display area (DA), and a driving circuit for driving the pixels may be provided therein.

The display area (DA) of the display panel 110 includes a light-emitting diode of a double-side emission type. Referring to FIG. 2, the light-emitting diode emits light to a top side that is an upper side and a bottom side that is a lower side with reference to the display panel 110. An organic light emitting diode may be used for the light-emitting diode of the double-side emission type. However, the light-emitting diode applicable to the display panel according to the present exemplary embodiment is not limited thereto. For example, a liquid crystal displaying diode may be applied.

The light emitted to a bottom of the display panel 110 is reflected by a skin of a user (R), and is received by the photosensor 200 that is positioned on a lower portion of the display area (DA).

Figure 8:
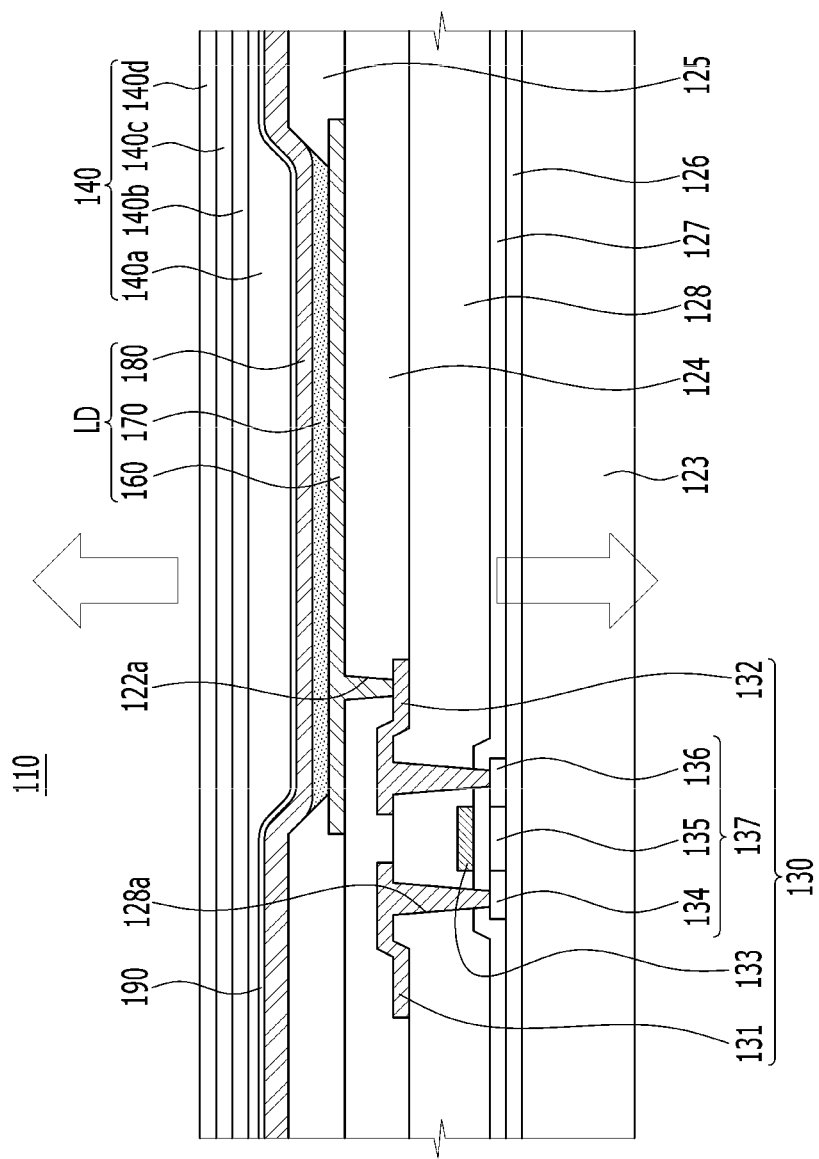
FIG. 8 shows an enlarged drawing of a display panel of FIG. 2.

Referring to FIG. 8, a display panel 110 including an organic light-emitting diode of a double-side emission type applicable to the present exemplary embodiment will now be described. A substrate 123 may be made of an inorganic material such as glass and an organic material such as a metallic material or a resin. The substrate 123 may transmit or block light, and it may be flexible.

A substrate buffer layer 126 is provided on the substrate 123. The substrate buffer layer 126 prevents impure components from passing through and planarize the surface of the substrate 123. The substrate buffer layer 126 may be made of various materials that may perform the above-noted functions. For example, the substrate buffer layer 126 may use one of a silicon nitride (SiNx) film, a silicon oxide (SiO$_x$) film, and a silicon oxynitride (SiOxNy) film. In some embodiments, the substrate buffer layer 126 may be omitted depending on a processing condition of the substrate 123.

A driving semiconductor layer 137 is provided on the substrate buffer layer 126. The driving semiconductor layer 137 may be made of a polysilicon film. The driving semiconductor layer 137 includes a channel region 135 in which an impurity is not doped, and a source region 134 and a drain region 136 that are doped to respective sides of the channel region 135. The doped ion material is a P-type impurity such as boron (B), and $B_2H_6$ is generally used. The impurity is variable depending on the type of a driving thin film transistor 130.

A gate insulating layer 127 made of silicon nitride (SiNx) or silicon oxide (SiO$_x$) is provided on the driving semiconductor layer 137. A gate line including a driving gate electrode 133 is provided on the gate insulating layer 127. The driving gate electrode 133 is provided to overlap at least a part of the driving semiconductor layer 137, particularly the channel region 135.

An interlayer insulating layer 128 for covering the driving gate electrode 133 is provided on the gate insulating layer 127. A contact hole 128a for exposing the source region 134 and the drain region 136 of the driving semiconductor layer 137 is provided in the gate insulating layer 127 and the interlayer insulating layer 128. The interlayer insulating layer 128 may be made of a ceramic-based material such as silicon nitride (SiNx) or silicon oxide ($SiO_x$).

A data line including a driving source electrode 131 and a driving drain electrode 132 is provided on the interlayer insulating layer 128. The driving source electrode 131 and the driving drain electrode 132 are connected to the source region 134 and the drain region 136 of the driving semiconductor layer 137 through the contact hole 128a in the interlayer insulating layer 128 and the gate insulating layer 127.

As described, a driving thin film transistor 130 is provided to include the driving semiconductor layer 137, the driving gate electrode 133, the driving source electrode 131, and the driving drain electrode 132. The configuration of the driving thin film transistor 130 is not limited to the above-described example, and it may be modified with a known configuration by a skilled person in the art.

A planarization layer 124 for covering the data line is provided on the interlayer insulating layer 128. The planarization layer 124 flattens a surface over the interlayer insulating layer 128 and the driving thin film transistor 130 to increase light emission efficiency of the organic light emitting diode to be provided thereon. The planarization layer 124 includes a via hole 122a for exposing a part of the drain electrode 132. The planarization layer 124 may be made of one material of a polyacrylate resin, an epoxy resin, a phenolic resin, a polyamide resin, a polyimide resin, an unsaturated polyester resin, a polyphenylene resin, a polyphenylene sulfide resin, and benzocyclobutene (BCB). An exemplary embodiment is not restricted to the above-described configuration, and one of the planarization layer 124 and the interlayer insulating layer 128 may be omitted in some embodiments.

A pixel electrode 160 of the organic light emitting diode is provided on the planarization layer 124. A plurality of pixel electrodes 160 are disposed on a plurality of pixels. The plurality of pixel electrodes 160 are separated from each other. The pixel electrode 160 is connected to the drain electrode 132 through the via hole 122a of the planarization layer 124.

A pixel definition layer 125 having an opening for exposing the pixel electrode 160 is provided on the planarization layer 124. The pixel definition layer 125 includes a plurality of openings for each pixel.

An organic emission layer 170 may be provided on the pixel electrode 160 in the opening provided by the pixel definition layer 125. Accordingly, a pixel area in which each organic emission layer 170 is provided may be defined by the pixel definition layer 125.

The pixel electrode 160 is disposed to correspond to the opening of the pixel definition layer 125. However, the pixel electrode 160 is not only disposed in the opening of the pixel definition layer 125, and a part of the pixel electrode 160 may be disposed below the pixel definition layer 125 so that it may overlap with the pixel definition layer 125. The pixel definition layer 125 may be made of a polyacrylate resin, a polyimide resin, or a silica-based inorganic material.

A common electrode 180 may be provided on the organic emission layer 170. Accordingly, the organic light emitting diode LD including the pixel electrode 160, the organic emission layer 170, and the common electrode 180 is provided.

According to an exemplary embodiment of the present disclosure, the pixel electrode 160 and the common electrode 180 may be made of a transparent conductive material. Therefore, the light emitted by the organic emission layer 170 may be emitted to a top side and a bottom side.

The pixel electrode 160 and the common electrode 180 may be made of a transflective conductive material and a transparent conductive material, respectively. The light emitted to the top side is used to display images, and the light emitted to the bottom side is used for the photosensor 200. The intensity of the light used for the photosensor 200 may be less than the intensity of the light used to display the image. Therefore, in the present exemplary embodiment, transmittance of the light emitted to the bottom side may be less than transmittance of the light emitted to the top side.

An overcoat 190 for covering and protecting the common electrode 180 may be formed of an organic film on the common electrode 180. A thin film encapsulation layer 140 is provided on the overcoat 190. The thin film encapsulation layer 140 seals and protects the organic light emitting diode LD and the driving thin film transistor 130 provided on the substrate 123.

The thin film encapsulation layer 140 includes organic encapsulation layers 140a and 140c and inorganic encapsulation layers 140b and 140d that are alternately stacked one by one. FIG. 8 exemplarily shows that two organic encapsulation layers 140a and 140c and two inorganic encapsulation layers 140b and 140d are alternately stacked to provide the thin film encapsulation layer 140, but the present embodiment is not limited thereto.

Referring to FIG. 1 and FIG. 2, the photosensor 200 is provided on a lower portion of the display area (DA) of the display panel 110. In particular, the photosensor 200 is provided between the display panel 110 and the protection plate 150. At least one photosensor 200 may be disposed on the lower portion of the display area (DA).

When the light emitted to the bottom side of the display panel 110 is reflected by the user (R), the photosensor 200 receives the reflected light. That is, light emitted to the bottom side of the display panel 110 passes through the protection plate 150, reflected by the skin of the user (R), and received by the photosensor 200.

The photosensor 200 may use the light reflected by the user (R) to measure a heart rate of the user (R). The light irradiated to the user (R) passes through the skin of the user (R) and reaches a blood vessel. When the heart of the user (R) spurts blood, a large amount of the light is absorbed into the blood so a small remaining amount of the light is reflected. In the opposite case, the amount of the blood absorbed into the blood is relatively small, and a large amount of the light is reflected. As described, the heart rate may be measured by measuring a change of a reflection rate of the light according to the amount of blood flowing in the blood vessel of the user (R).

According to an exemplary embodiment of the present disclosure, the photosensor 200 does not use an additional light source but may use the light emitted to the bottom side of the display panel 110 as a light source. Therefore, compared to a conventional device using an additional light source and consuming additional power to operate the additional light source, the present display device has a simpler configuration with reduced power consumption, and the production cost may be reduced.

Referring to FIG. 2 and FIG. 3, the photosensor 200 may include a shutter 210 and a photodetector 250. The shutter 210 may control the light emitted to the bottom side of the display panel 110 from passing through the protection plate 150. That is, the light may transmit through the protection plate 150 or may be blocked by the shutter 210.

As shown in FIG. 2, when the shutter 210 is closed, the light emitted to the bottom side of the display panel 110 cannot transmit through the protection plate 150. The light that is not transmitted may be reflected by the shutter 210 and may be transmitted to the top side of the display panel 110.

As shown in FIG. 3, when the shutter 210 is opened, the light emitted to the bottom side of the display panel 110 transmits through the protection plate 150. The transmitted light is reflected by the skin of the user (R) and is received by the photodetector 250.

Figure 4:
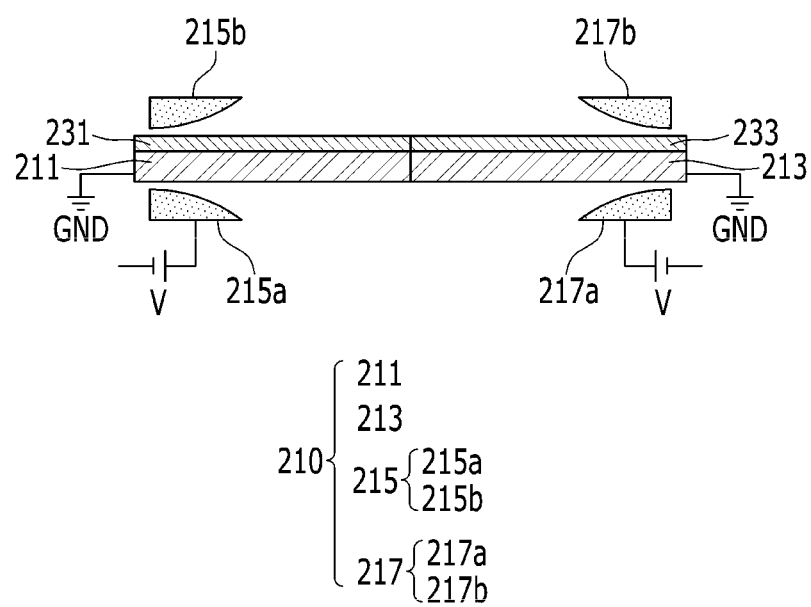
FIG. 4 and FIG. 5 show a detailed configuration of a shutter.
Figure 5:
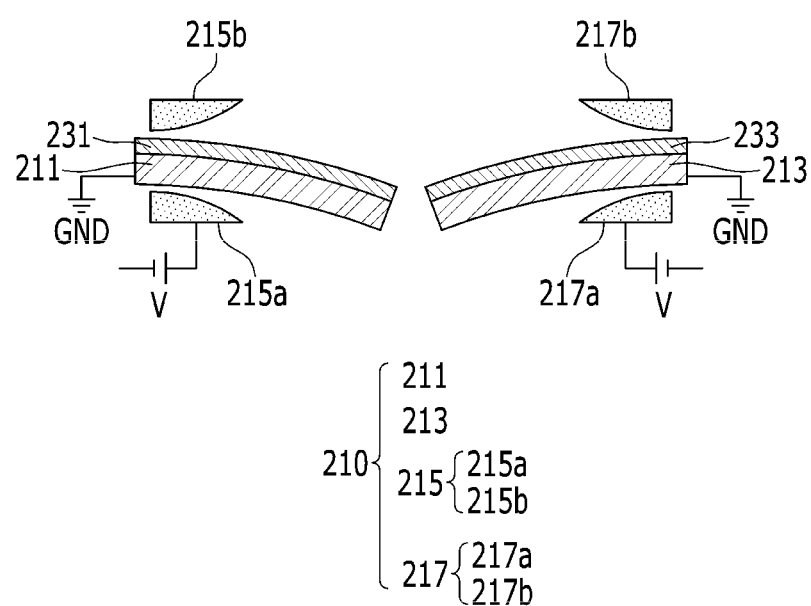

A configuration of the shutter 210 will be described in detail with reference to FIG. 4 and FIG. 5. FIG. 4 and FIG. 5 show a detailed configuration of a shutter.

Referring to FIG. 4 and FIG. 5, the shutter 210 may include first and second blocking plates 211 and 213 and induction electrodes 215 and 217. The first and second blocking plates 211 and 213 are a pair of plate members that are disposed in parallel, and they may be opened and shut. When the shutter 210 is closed to block the transmission of light, respective ends of the first and second blocking plate 211 and 213 are closed to closely face with each other. The first and second blocking plates 211 and 213 may be made of a light-blocking material for blocking optical transmission.

When the shutter 210 is opened to transmit light, the respective ends of the first and second blocking plates 211 and 213 are bent toward an upper side or a lower side. When the first and second blocking plates 211 and 213 are bent, the respective ends of the first and second blocking plates 211 and 213 are separated from each other. Therefore, a gap for transmitting light is generated between the first and second blocking plates 211 and 213. The light emitted to the bottom side of the display panel 110 may be transmitted to the protection plate 150 through the gap.

As shown in FIG. 4, in the present exemplary embodiment, the respective ends of the first and second blocking plates 211 and 213 are incised in a vertical direction with respect to a horizontal plane. When the respective ends are disposed to be closely facing with each other, transmission of the light emitted to the bottom side of the display panel 110 may be blocked.

It is noted that the present example is not restricted to the configuration shown in FIGS. 3 and 4, the respective ends of the first and second blocking plates 211 and 213 may have various shapes.

Figure 6:
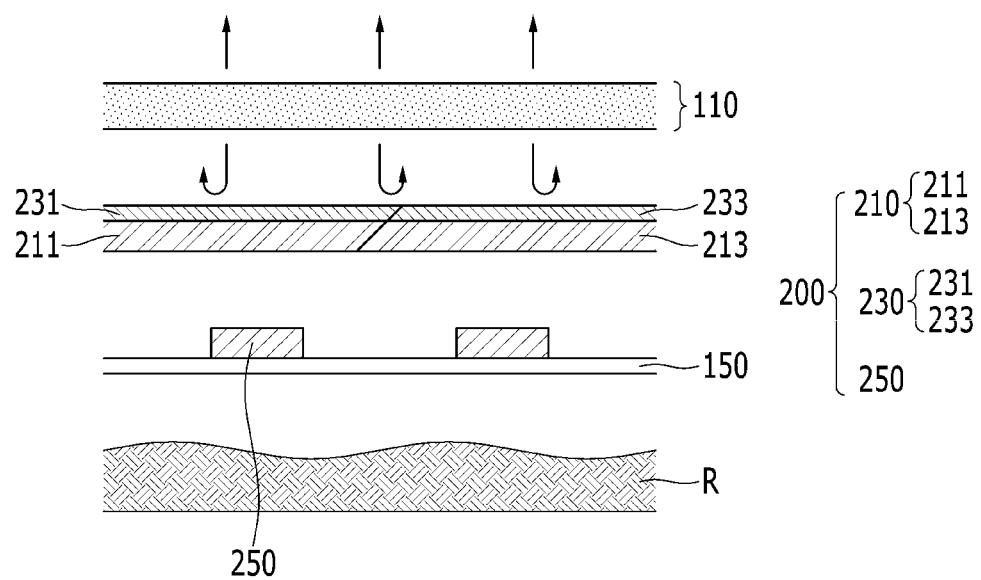
FIG. 6 and FIG. 7 show cross-sectional views of a display device, according to an exemplary variation of an exemplary embodiment of the present disclosure.

For example, as shown in FIG. 6, one of the respective ends of the first and second blocking plates 211 and 213 may be provided to be inclined at a predetermined angle. The one end may be provided to be inclined corresponding to the other end. The respective ends are inclined at a predetermined angle, so when the respective ends are closely facing with respect to each other, the light emitted to the bottom side of the display panel 110 may be efficiently blocked.

Figure 7:
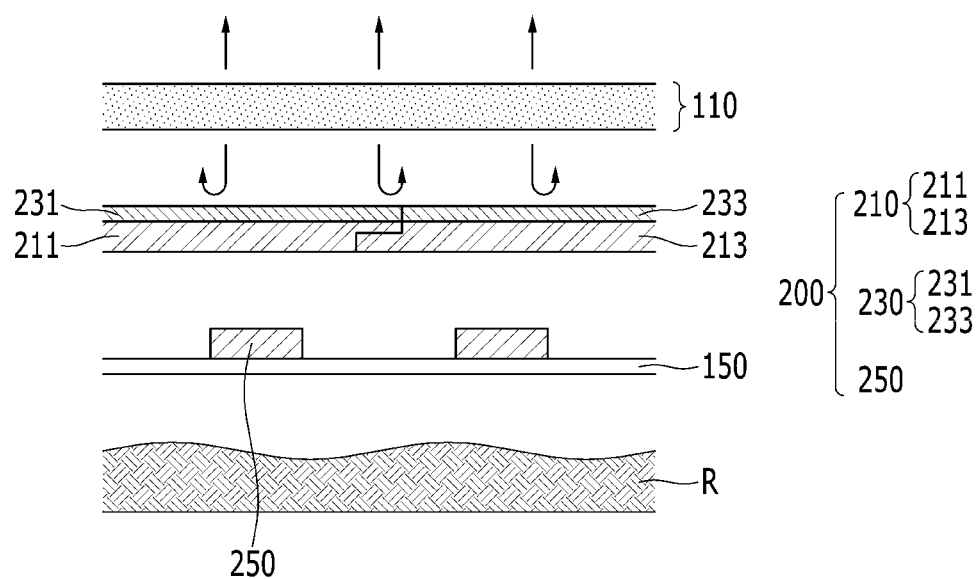

Referring to FIG. 7, one of the respective ends of the first and second blocking plates 211 and 213 may have a step shape. The other end may have a step shape corresponding to the one end. As shown in FIG. 7, the respective ends have a step shape to efficiently block the light emitted to the bottom side of the display panel 110.

Referring to FIG. 4 and FIG. 5, the induction electrodes 215 and 217 may be provided on at least one of an upper side and a lower side of each of the first and second blocking plates 211 and 213. In the present exemplary embodiment, the induction electrodes 215a and 215b are separately disposed on the upper side and the lower side of the first blocking plate 211. Further, the induction electrodes 217a and 217b are separately disposed on the upper side and the lower side of the second blocking plate 213.

When the first and second blocking plates 211 and 213 are bent in a direction, for example, a lower side direction, the induction electrode 215a may be disposed on the lower side of the first blocking plate 211, and the induction electrode 217a may be disposed on the lower side of the second blocking plate 213. On the contrary, when the first and second blocking plates 211 and 213 are bent in an upper side direction, the induction electrode 215b may be disposed on the upper side of the first blocking plate 211, and the induction electrode 217b may be disposed on the upper side of the second blocking plate 213.

Referring to FIG. 5, when a voltage (V) is applied to the induction electrode 215a disposed on the lower side of the first blocking plate 211 and the induction electrode 217a disposed on the lower side of the second blocking plate 213, an electric force is generated between the first blocking plate 211 and the induction electrode 215a and between the second blocking plate 213 and the induction electrode 217a. The first and second blocking plates 211 and 213 may be grounded (GND). The electric force may include an electrostatic force.

An electric force is generated between the first blocking plate 211 and the induction electrode 215a, and the first blocking plate 211 is bent toward the induction electrode 215a. Similarly, an electric force is generated between the second blocking plate 213 and the induction electrode 217a, and the second blocking plate 213 is bent toward the induction electrode 217a.

An electric force that is generated between the first and second blocking plates 211 and 213 and the induction electrodes 215 and 217 bends and the first and second blocking plates 211 and 213 upwardly or downwardly. Accordingly, the shutter 210 may be opened and closed.

According to an exemplary embodiment of the present disclosure, a reflective layer 230 may be provided on upper sides of the first and second blocking plates 211 and 213. The reflective layer 120 includes a first reflective layer 231 that is provided on the first blocking plate 211 and a second reflective layer 233 that is provided on the second blocking plate 213.

When the shutter 210 is closed, the reflective layer 230 may reflect the light emitted to the bottom side of the display panel 110 to the top side of the display panel 110. That is, when the photosensor 200 does not need the light emitted by the display panel 110, the reflective layer 230 may reflect the light to the top side of the display panel 110 to increase light emission efficiency of the display device.

The reflective layer 230 may be made of a metal selected from silver (Ag), aluminum (Al), and chromium (Cr), or an alloy thereof. The reflective layer 230 may provide the metal on the first and second blocking plates 211 and 213 according to a deposition process.

As shown in FIG. 2 and FIG. 3, the photodetector 250 is disposed between the shutter 210 and the protection plate 150. At least one photodetector 250 may be included in the photosensor 200.

The photodetector 250 receives the light reflected by the user (R). In particular, the photodetector 250 receives the light reflected by the blood flowing in the blood vessel of the user (R).

According to the present exemplary embodiment, the photodetector 250 may include at least one photodiode. The photodiode generates a photocurrent corresponding to the intensity of the light reflected to the blood.

The protection plate 150 is provided on the lower portion of the photosensor 200. The protection plate 150 protects the display panel 110 and the photosensor 200 of the display device 100. The protection plate 150 may be made of plastic, tempered plastic, glass, tempered glass, or metal.

A light transmitting window through which the light may transmit is provided on a position corresponding to the photosensor 200 on the protection plate 150. The protection plate 150 may be made of a transparent material, or a region except the light transmitting window may be provided to be opaque.

A display device according to another exemplary embodiment will now be described. The same or similar configurations as the previously described display device may not be described.

Figure 9:
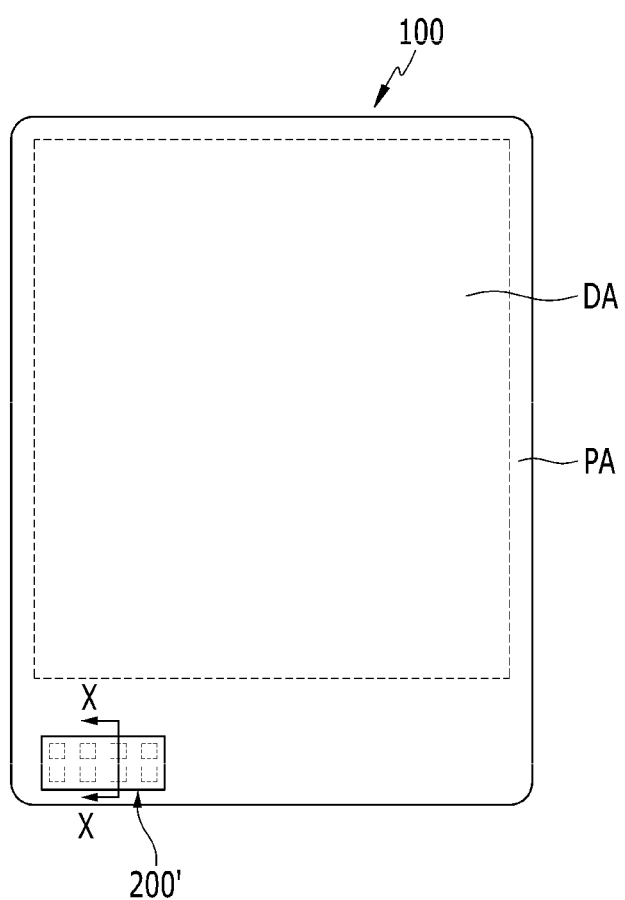
FIG. 9 shows a top plan view of a display device, according to another exemplary embodiment of the present disclosure.
Figure 10:
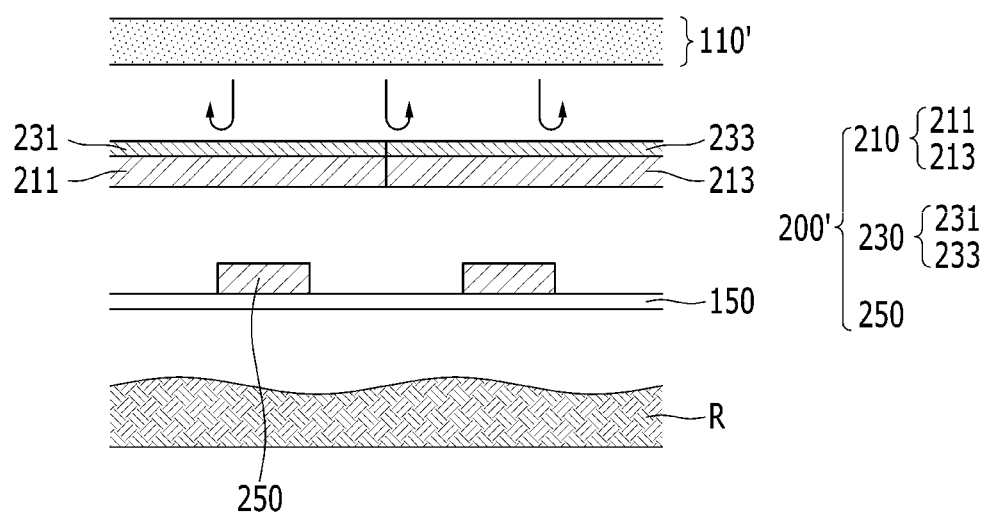
FIG. 10 shows a cross-sectional view of a display device with respect to a line X-X of FIG. 9.
Figure 11:
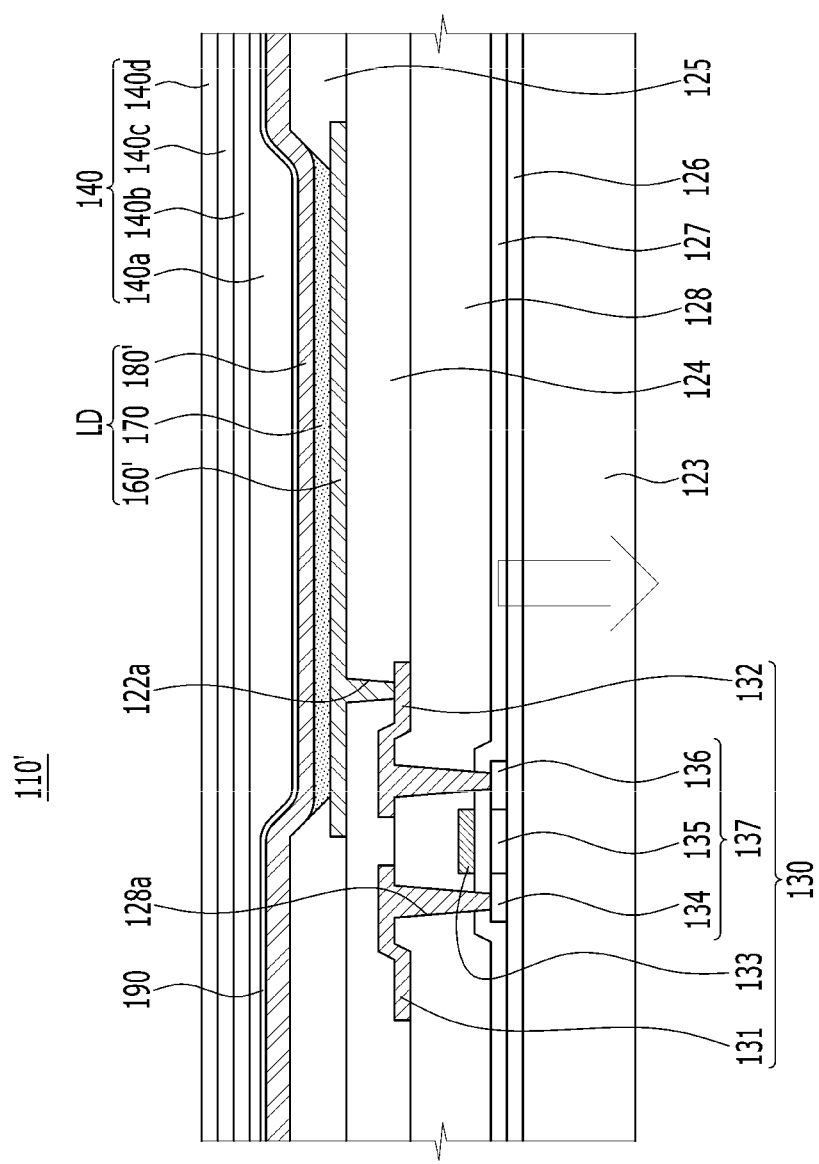
FIG. 11 shows an enlarged drawing of a display panel of FIG. 10.

FIG. 9 shows a top plan view of a display device, according to another exemplary embodiment of the present disclosure, FIG. 10 shows a cross-sectional view of a display device with respect to a line X-X of FIG. 9, and FIG. 11 shows an enlarged drawing of a display panel of FIG. 10.

Referring to FIG. 9 to FIG. 11, the display device according to another exemplary embodiment is different in configuration of a photosensor 200' and a display panel 110' compared to the display device according to the described exemplary embodiment.

In the previously described exemplary embodiment, the photosensor 200 is provided in the display area (DA), and the display area (DA) of the display panel 110 is made of a light-emitting diode of a double-side emission type. However, the photosensor 200' is provided on a lower portion of a peripheral area (PA) of the display panel 110', and the peripheral area (PA) of the display panel 110' includes a light-emitting diode of a bottom emission type.

Referring to FIG. 9, the photosensor 200' is provided on the lower portion of a peripheral area (PA) of the display panel 110'. In particular, the photosensor 200' is provided between the display panel 110' and the protection plate 150'. At least one photosensor 200' may be disposed on the lower portion of the peripheral area (PA).

The photosensor 200' uses the light emitted by the peripheral area (PA) of the display panel 110'. That is, differing from the photosensor 200 shown in FIG. 1 that uses the light emitted by the display area (DA) of the display panel 110, the photosensor 200' uses the light emitted by the peripheral area (PA) of the display panel 110'.

Referring to FIG. 10, the peripheral area (PA) of the display panel 110' may be made of a light-emitting diode of a bottom-emission type. That is, the peripheral area (PA) of the display panel 110' may be made of a light-emitting diode emitting light to the lower side, that is, the bottom side of the display panel 110'. The light-emitting diode of the bottom emission type may use an organic light emitting diode.

In the present exemplary embodiment, the display area (DA) except the peripheral area (PA) of the display panel 110' may be made of a light-emitting diode of a top-emission type or a double-side emission type.

The light-emitting diode of the bottom-emission type may be a dummy pixel. The dummy pixel is not used for displaying an image, and it represents a pixel for generating light used for the photosensor 200'. As a result, the light-emitting diode of the top emission or the double-side emission type is used for displaying an image in the display area (DA), and the light-emitting diode of the bottom emission type is used for the photosensor 200' in the peripheral area (PA).

Referring to FIG. 11, a pixel electrode 160' and a common electrode 180' may be made of a transparent conductive material and a reflective conductive material, respectively. The pixel electrode 160' is made of a transparent conductive material so the light emitted by the organic emission layer 170 may be emitted to the bottom side. Further, the common electrode 180' is made of a reflective conductive material so the light emitted by the organic emission layer 170 may be reflected by the common electrode 180' and may be transmitted to the bottom side.

The pixel electrode 160' and the common electrode 180' may be made of a transflective conductive material and a reflective conductive material, respectively. That is, in the present exemplary embodiment, the photosensor 200' transmits the light emitted by the light-emitting diode of the bottom-emission type in the peripheral area (PA) through the protection plate 150' and receives the light reflected by the user (R).

A display device according to yet another exemplary embodiment will now be described. The same or similar configurations of the previously described display device may not be described.

Figure 12:
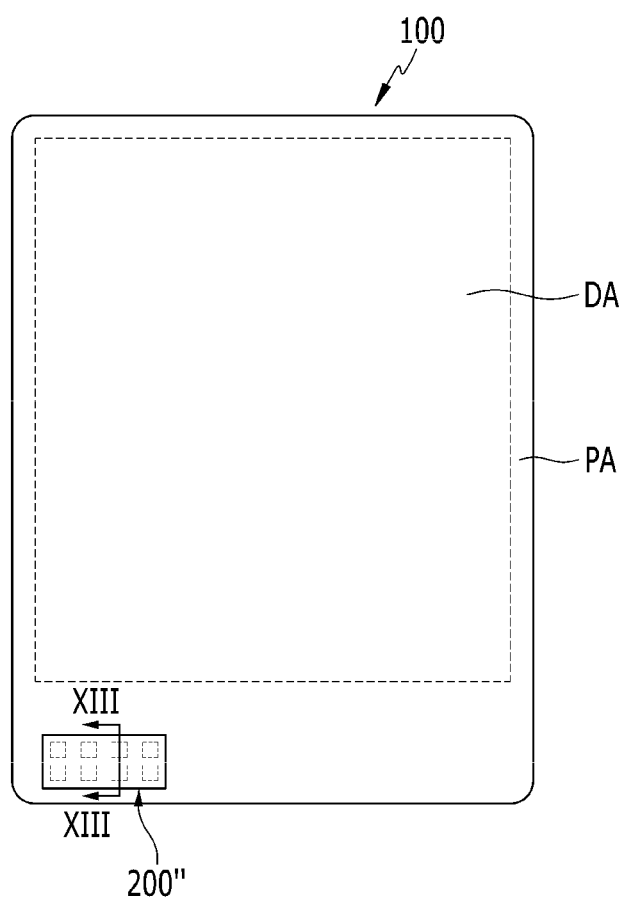
FIG. 12 shows a top plan view of a display device, according to yet another exemplary embodiment of the present disclosure.
Figure 13:
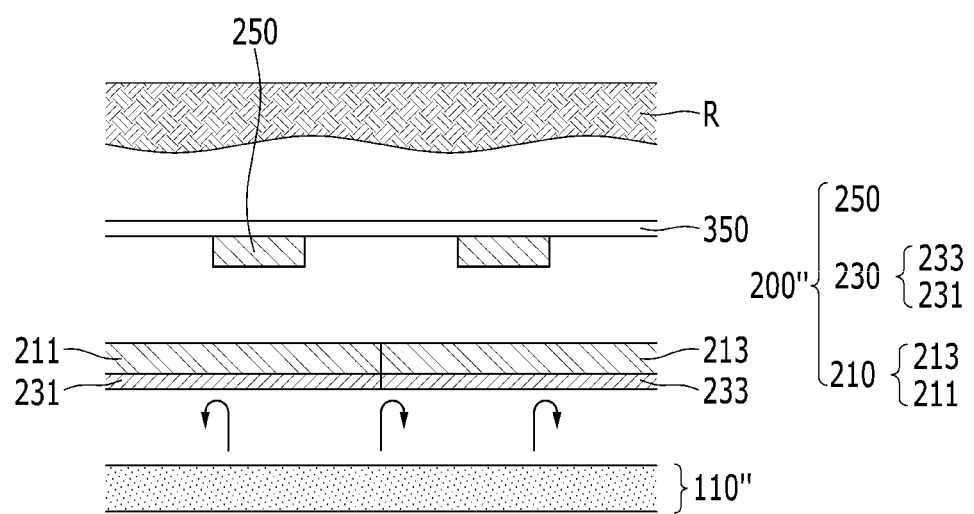
FIG. 13 shows a cross-sectional view of a display device with respect to a line XIII-XIII of FIG. 12.
Figure 14:
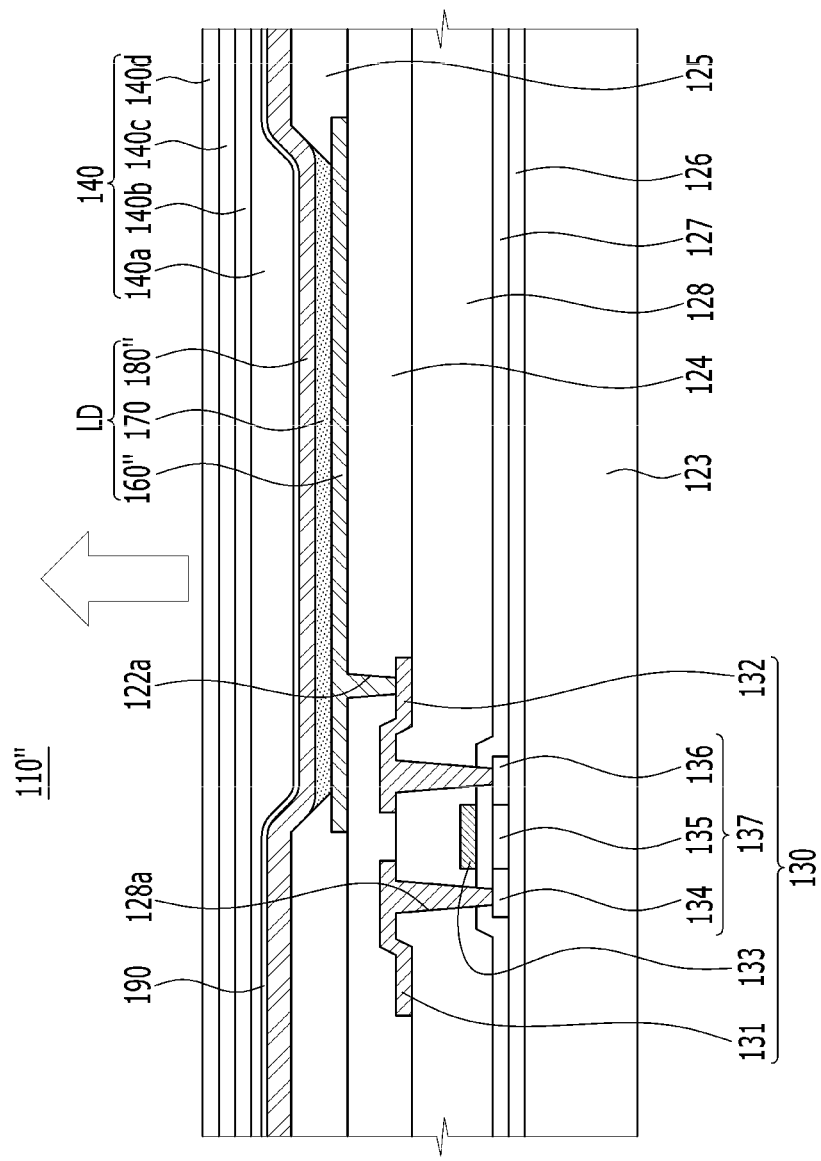
FIG. 14 shows an enlarged drawing of a display panel of FIG. 13.

FIG. 12 shows a top plan view of a display device, according to the yet another exemplary embodiment of the present disclosure, FIG. 13 shows a cross-sectional view of a display device with respect to a line XIII-XIII of FIG. 12, and FIG. 14 shows an enlarged drawing of a display panel of FIG. 13.

Referring to FIG. 12 to FIG. 14, the photosensor 200" of the display device is provided between a window 350 and a display panel 110". In the previously described exemplary embodiments, the photosensors (200, 200') are disposed between the display panels (110, 110) and the protection plate 150, and in the present exemplary embodiment, the photosensor 200" is disposed on the top side of the display device 110".

The photosensor 200" is provided on the upper portion of the peripheral area (PA) of the display panel 110", and the peripheral area (PA) of the display panel 110" is made of a light-emitting diode of a top-emission type. At least one of photosensor 200" may be disposed on the upper portion of the peripheral area (PA).

The photosensor 200" uses the light emitted in the peripheral area (PA) of the display panel 110". Compared to the photosensors (200, 200) shown in FIG. 1 and FIG. 9, the photosensor 200" may use the light emitted to the top side of the display device 110" in the peripheral area (PA).

Referring to FIG. 13, the peripheral area (PA) of the display panel 110" may be made of a light-emitting diode of a top-emission type. That is, the peripheral area (PA) of the display panel 110" may be made of a light-emitting diode for emitting light to the top side, that is, the upper side of the display panel 110". The light-emitting diode of the top-emission type may be an organic light emitting diode.

In the present exemplary embodiment, the display area (DA) except the peripheral area (PA) of the display panel 110" may be made of a light-emitting diode of a top emission or a double-side emission type.

The light-emitting diode of the top-emission type may be a dummy pixel. The dummy pixel is not used for displaying an image, and represents a pixel for generating the light used for the photosensor 200". Resultantly, the light-emitting diode of the top emission or the double-side emission type in the display area (DA) is used for displaying an image, and the light-emitting diode of the top-emission type in the peripheral area (PA) is used for the photosensor 200".

Referring to FIG. 14, a pixel electrode 160" and a common electrode 180" may be made of a reflective conductive material and a transparent conductive material, respectively. The pixel electrode 160" is made of a reflective conductive material so the light emitted by the organic emission layer 170 may be emitted to the top side. Further, the common electrode 180" is made of a transparent conductive material so the light emitted by the organic emission layer 170 may pass through the common electrode 180" and may be transmitted to the top side. The pixel electrode 160" and the common electrode 180" may be made of a reflective conductive material and a transflective conductive material, respectively.

That is, in the present exemplary embodiment, the photosensor 200" transmits the light emitted by the light-emitting diode of the top-emission type in the peripheral area (PA) through the window, and receives the light reflected by the user (R).

Regarding the display device according to exemplary embodiments of the present disclosure, the photosensors (200, 200', 200") do not use an additional light source, and they may use the light emitted by the light-emitting diode of the double-side emission type in the display area (DA) of the display panel 110 or the light-emitting diode of the bottom-emission type in the peripheral area (PA) of the display panel (110', 110") as a light source. Therefore, compared to the conventional device using an additional light source, the present display device has a simpler configuration, and the product cost may be reduced. The light emitted by the display panels (110, 110', 110") is used as a light source to reduce power consumption.

While the present disclosure has been described in connection with the exemplary embodiments described herein, it is to be understood that the present disclosure is not limited to the disclosed embodiments, but, instead, is intended to cover various modifications and equivalent arrangements included within the spirit and scope of the present disclosure.

What is claimed is:

1. A display device comprising:
a display panel including a display area for displaying an image;
a window provided on an upper portion of the display panel;
a protection plate provided on a lower portion of the display panel; and
a photosensor provided at least one of between the display panel and the window and between the display panel and the protection plate,
wherein the photosensor includes:
a shutter for controlling light emitted by the display panel to transmit through the window or the protection plate, and
a photodetector for receiving the light reflected after transmitting through the window or the protection plate.

2. The display device of claim 1, wherein
the photosensor is disposed on a position corresponding to the display area between the display panel and the protection plate.

3. The display device of claim 2, wherein
the display panel includes an organic light-emitting diode of a double-side emission type provided in the display area.

4. The display device of claim 3, wherein
the organic light emitting diode includes:
a first electrode connected to a thin film transistor provided on a substrate;
an organic emission layer provided on the first electrode; and
a second electrode provided on the organic emission layer,
wherein the first and second electrodes are transparent electrodes.

5. The display device of claim 4, wherein
the thin film transistor includes:
a semiconductor layer provided on the substrate;
a gate electrode provided on the semiconductor layer; and
a source electrode and a drain electrode provided on the gate electrode and connected to the semiconductor layer.

6. The display device of claim 1, wherein
the display panel further includes a peripheral area disposed on a periphery of the display area, and
the photosensor is disposed on a position corresponding to the peripheral area between the display panel and the protection plate.

7. The display device of claim 6, wherein
the display panel includes a dummy pixel provided in the peripheral area.

8. The display device of claim 7, wherein
the dummy pixel is an organic light-emitting diode of a bottom-emission type.

9. The display device of claim 8, wherein
the organic light emitting diode includes:
a first electrode connected to a thin film transistor provided on a substrate;
an organic emission layer provided on the first electrode; and
a second electrode provided on the organic emission layer,
wherein the first electrode is a transparent electrode, and the second electrode is a reflecting electrode.

10. The display device of claim 1, wherein
the display panel further includes a peripheral area disposed on a periphery of the display area, and
the photosensor is disposed on a position corresponding to the peripheral area between the display panel and the window.

11. The display device of claim 10, wherein
the display panel includes a dummy pixel provided in the peripheral area.

12. The display device of claim 11, wherein
the dummy pixel is an organic light-emitting diode of a top-emission type.

13. The display device of claim 12, wherein
the organic light emitting diode includes:
a first electrode connected to a thin film transistor provided on a substrate;
an organic emission layer provided on the first electrode; and
a second electrode provided on the organic emission layer,
wherein the first electrode is a reflecting electrode, and second electrode is a transparent electrode.

14. The display device of claim 1, wherein
the photodetector includes at least one photodiode.

15. The display device of claim 1, wherein
the protection plate includes a light transmitting window on a position corresponding to the photosensor.

16. The display device of claim 1, wherein
the shutter includes first and second blocking plates that can be controlled to be opened and closed.

17. The display device of claim 16, wherein the first and second blocking plates are bent.

18. The display device of claim 16, wherein the first and second blocking plates are made of a conductive material.

19. The display device of claim 16, wherein the shutter further includes an induction electrode provided on at least one of an upper side and a lower side of the first and second blocking plates and generating an electric force.

20. The display device of claim 16, wherein a reflective layer is provided on the first and second blocking plates.

21. The display device of claim 20, wherein the reflective layer is made of a metal selected from silver (Ag), aluminum (Al), and chromium (Cr), or an alloy thereof.

22. The display device of claim 16, wherein a first end of the first and second blocking plates is inclined at a predetermined angle, and a second end of the first and second blocking plates is made of a shape corresponding to the first end.

23. The display device of claim 16, wherein a first end of the first and second blocking plates is provided to have a step shape, and a second end of the first and second blocking plates is made of a shape corresponding to the first end.

* * * * *